United States Patent [19]

Hidaka

[11] Patent Number: 4,922,367

[45] Date of Patent: May 1, 1990

[54] CIRCUIT FOR PREVENTING LATCH-UP OF PARASITIC THYRISTOR FORMED IN CMOS INTEGRATED CIRCUIT

[75] Inventor: Hideto Hidaka, Hyogo, Japan

[73] Assignee: Mitsubishi Denki Kabushiki Kaisha, Japan

[21] Appl. No.: 165,802

[22] Filed: Mar. 9, 1988

[30] Foreign Application Priority Data

Jul. 21, 1987 [JP] Japan .................. 62-182697

[51] Int. Cl.$^5$ .............................................. H02H 9/02
[52] U.S. Cl. ........................................ 361/58; 361/19;
361/104; 361/111; 361/141; 323/360; 338/325;
505/850; 505/881; 505/869
[58] Field of Search ................ 361/19, 43, 58, 93,
361/103, 104, 111, 141, 385; 323/369, 908, 304;
338/325; 505/850, 869, 881, 885, 891, 899;
174/15.4; 357/82, 83

[56] References Cited

U.S. PATENT DOCUMENTS 3,251,715  5/1966  Miles et al. ..................... 338/325
3,703,664  11/1972  Cronin ........................... 361/58
3,925,707  12/1975  Bhake et al. ...................... 361/3

FOREIGN PATENT DOCUMENTS 1019888  2/1966  United Kingdom ............... 338/15.4

*Primary Examiner*—Todd E. DeBoer
*Attorney, Agent, or Firm*—Leydig, Voit & Mayer

[57] ABSTRACT

A CMOS circuit including a variable conductor means interposed between a power supply and the CMOS circuit. The CMOS circuit comprises a P channel MOS FET and an N channel MOS FET laterally formed on the surface of a semiconductor substrate, inherently producing a parasitic thyristor which can be latched-up with destructive consequences under certain circumstances. The variable conductor means, interposed between the power supply and CMOS circuit, preferably includes a superconductor arranged to sharply switch to a normal conductor mode when the current level exceeds a critical current level, established to be less than the latch-up holding current of the parasitic thyristor, thereby to prevent latch-up.

13 Claims, 3 Drawing Sheets

CIRCUIT FOR PREVENTING LATCH-UP OF PARASITIC THYRISTOR FORMED IN CMOS INTEGRATED CIRCUIT

BACKGROUND OF THE INVENTION

1. Field of the Invention

The present invention relates to CMOS integrated circuits and more particularly to a protective circuit for preventing latch-up of the parasitic thyristor which exists in the CMOS integrated structure.

2. Description of the Prior Art

It is well known that the conventional CMOS circuit comprises a P channel MOS transistor and an N channel MOS transistor formed on the surface of a semiconductor substrate. It is also well known that due to the positioning and interconnection of the various regions on the substrate, a parasitic thyristor structure inevitably exists. The parasitic thyristor is formed in such a way that when triggered, such as by power supply transients, the parasitic thyristor is connected as a substantial short circuit across the power supply. As a result, if the parasitic thyristor is triggered and latches on, substantial, usually destructive, currents flow from the power supply through the MOS integrated circuit. As an example, the large current can substantially increase the power dissipated in the MOS circuit, overheating and ultimately destroying the circuit. As integration circuit densities of CMOS circuits increase, the latch-up phenomenon associated with parasitic thyristors becomes more serious, resulting in a decrease in the reliability of the circuit and a practical limitation in the integration density.

Figure 1:
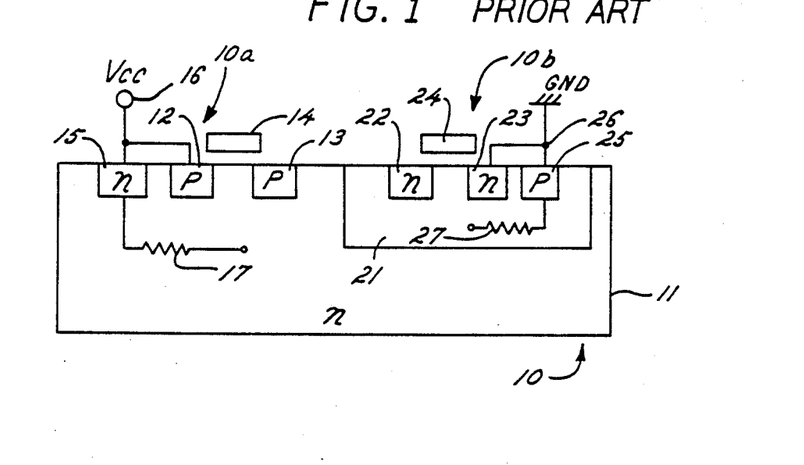
FIG. 1 is a diagram showing an exemplary structure of a conventional CMOS circuit device.

The latch-up problem will be better appreciated with reference to FIG. 1 which is a diagram showing the structure of a conventional and typical CMOS (complementary MOS) circuit. As shown in FIG. 1, a CMOS circuit 10 comprises a P channel MOS region 10a and an N channel MOS region 10b, formed in predetermined regions of an N type semiconductor substrate 11.

The P channel MOS transistor 10a comprises a P type impurity diffusion region (a source region) 12 and a P type impurity diffusion region 13 (a drain), each formed in a predetermined region on the surface of the semiconductor substrate 11. A gate electrode 14 is formed over the surface of the semiconductor substrate 11 between the P type impurity diffusion regions 12 and 13, and an insulating film (not shown) is interposed therebetween.

On the other hand, the N channel MOS transistor is formed in a P type well 21 formed on the surface of the N type semiconductor substrate 11. More specifically, the N channel MOS transistor 10b comprises an N type impurity diffusion region (a drain) 22 and an N type impurity diffusion region 23 (a source) each diffused into the P type well 21. A gate electrode 24 is formed over the surface of the P type well 21 between the N type impurity diffusion regions 22 and 23, and an insulating film (not shown) is interposed therebetween.

The P channel MOS transistor region is provided with an N type impurity diffusion region 15 for providing electrical connection to the N type semiconductor substrate 11. In addition, a P type impurity diffusion region 25 for providing electrical contact to the P type well 21 is provided in the P type well 21. The N type impurity diffusion region 15 and the P type impurity diffusion region 25 for providing electrical connection to the substrate 11 and the well 21 provide substrate bias, respectively, so that the potentials on the substrate and the well are stabilized.

The illustrated CMOS circuit, and typically a plurality of such CMOS circuits arranged to perform a complex function, are provided with connection means 16, 26 for connecting the circuit to a power supply. It is seen that the connection terminal 16 is arranged for connection to the positive terminal of a power supply $V_{cc}$, and the thus supplied positive voltage is connected to both the N type impurity diffusion region 15 and P type impurity diffusion region 12. Similarly, the negative terminal of the power supply is connected to ground interconnect terminal 26 (GND) which in turn is connected to the N type impurity diffusion region 23 and the P type impurity diffusion region 25 of the N channel MOS transistor. Also as illustrated in FIG. 1, the semiconductor substrate 11 has a substrate distributed resistance shown as resistor 17 and the P type well also has a distributed resistance shown as resistor 27.

Figure 2:
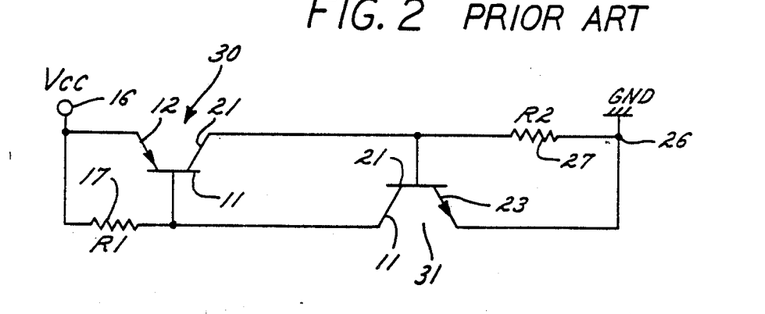
FIG. 2 is a diagram showing an equivalent circuit of a parasitic thyristor formed in the CMOS circuit device of FIG. 1.

As will be appreciated by those familiar with CMOS circuitry, the conventional CMOS circuit illustrated in FIG. 1, including the N channel transistor and P channel transistor formed on the surface of the semiconductor substrate, has an inherent parasitic thyristor which, when triggered, provides a connection across the power supply terminals Vcc and GND. FIG. 2 is a diagram showing an equivalent circuit of the parasitic thyristor formed in the CMOS circuit of FIG. 1. In FIG. 2, the parasitic thyristor comprises cross-coupled bipolar transistors 30, 31.

The PNP parasitic bipolar transistor 30 includes an emitter, the P type impurity diffusion source region 12; a base, the N type substrate 11; and a collector, the P type material of the well 21. The NPN parasitic bipolar transistor includes a collector, the N type substrate 11; a base, the P type well 21; and an emitter, the N type impurity diffusion drain region 23. Because the N channel substrate and P well 21 are common to both of the parasitic transistors, the base to collector connections illustrated in FIG. 2 are inherently present. Furthermore, the base to emitter resistances 17 and 27 of FIG. 2 are provided by the substrate resistances 17, 27 described in connection with FIG. 1.

The parasitic bipolar transistors 30, 31, and thus the parasitic thyristors formed by cross coupling those transistors are generally biased to be rendered non-conductive. However, if current laterally flows in the semiconductor substrate 11 and the P type well 21, a potential difference is formed across each of the resistances 17 and 27. As a result, the parasitic transistors 30 and 31 are provided with base current and thus begin to conduct.

It will be appreciated that if conduction increases to a predetermined level, the cross coupling of the transistors will cause the parasitic thyristor to latch on, imposing a connection across the power supply terminals 16, 26 which is substantially a short circuit.

The manner in which latch-up occurs will now be described. As shown in FIG. 2, terminal 16 is normally connected to the positive terminal of the power supply $V_{cc}$ (typically 5 volts) and the terminal 26 to the negative terminal of the power supply, typically referred to as ground GND. Whenever current is flowing laterally in the semiconductor substrate and P type well 21, there will be a voltage drop across resistances 17 and 27. Since the resistance 17 is connected between the emitter 12 and base 11 of the PNP transistor 30, the potential of the base 11 will decrease with respect to that of the emitter 12. Thus, the PNP transistor 30 will begin to turn on, allowing current flow from emitter 12 to collector 21, raising the voltage at the base 21 of the NPN transistor 31. Thus, since the emitter of the transistor 31 is grounded, the transistor 31 also begins to turn on, so that current flow which had initiated at the $V_{cc}$ terminal is returned to the ground terminal 26. As a result, the voltage drop across the resistance 17 is further increased, further increasing the base drive to PNP transistor 30 so that the transistor 30 turns on deeper. As a result, a higher voltage is applied to the base of the NPN transistor 31, so that the transistor 31 is also turned on more deeply. As a result, current flows from the positive power supply terminal $V_{cc}$ through the parasitic transistors 30, 31 (which as noted above are cross coupled to form a parasitic thyristor) to the ground terminal GND. This conductive state of the parasitic transistors is referred to as latch-up of the parasitic thyristor, and as will now be apparent produces substantial power consumption in the CMOS circuit. As a result, the CMOS circuit may be destroyed by heat generated due to the power dissipated in the parasitic thyristor.

Steps have been taken in the prior art in order to prevent or minimize the possibility of such a latch-up phenomenon. Those approaches have included:

(1) An N+ impurity diffusion region or a P+ impurity diffusion region (a guard band) is provided between the N channel transistor region and the P channel transistor region so that the well potential is stabilized (the potential gradient in the well region is removed) and the minority carriers are absorbed in the above described region to reduce the lifetime of the minority carriers, whereby latch-up immunity is increased.

(2) Impurities or neutrons are implanted into the semiconductor substrate and the well region so that the current gain of each of the transistors 30 and 31 of the parasitic thyristors is decreased, whereby current flowing through the parasitic transistors is reduced.

(3) The P type well is deep formed or an impurity concentration in the P type well region is increased so that resistance of the well region is reduced, whereby the well potential is stabilized.

In addition to the above described approaches, an approach of providing voltage drop means between the power-supply voltage $V_{cc}$ and the source region of the parasitic bipolar transistor has been considered, which is disclosed in, for example, Japanese Patent Laying-Open Gazette No. 130557/1983.

The foregoing approaches used to prevent or minimize latch-up in a CMOS circuit have a number of disadvantages. With respect to those which alter the semiconductor structure itself, such as the first three listed above, typically the approach has complicated the manufacturing process, such as by requiring additional steps for implantation of impurities or provision of a guard band. The added structure also tends to reduce the integration density which would otherwise be possible. Integration density is decreased not only for allowing the inclusion of additional structure such as guardbands, but also in providing sufficient distance between the various regions of the integrated circuit since very tight packing aggravates the parasitic thyristor latch-up problem. The power supply limiting approach also has its disadvantages in requiring a normally unwanted voltage drop between the power supply and the CMOS circuit, in the ability to reliably prevent latch-up under all conditions, and, in some cases, in the reproducibility of the voltage drop needed to prevent latch-up.

Nor has it been possible to alleviate the problem of latch-up in a CMOS circuit by appropriate power supply design, such as by incorporation of a current foldback circuit. Most significantly, the response time of known current foldback circuits is not sufficient to prevent latch-up, and furthermore the current foldback circuits are complicated and impractical to integrate on-chip, and are therefore not suitable for a CMOS integrated circuit.

SUMMARY OF THE INVENTION

In view of the foregoing it is a general aim of the present invention to provide a CMOS integrated circuit of enhanced reliability, particularly one in which the danger of parasitic thyristor latch-up is significantly reduced, while avoiding additional complication to the integrated circuit structure itself.

More particularly, it is an object of the present invention to provide a latch-up protection circuit capable of rendering a CMOS circuit latch-up free without complications in the integrated circuit structure which would, for example, decrease the possible integration density or complicate the manufacturing process.

In accomplishing those objectives, there is provided a latch-up protection circuit in which a variable conductor means of predetermined characteristics is coupled between the power supply and the power terminals of the integrated circuit. The variable conductor means has a resistance which increases sharply when a critical current level is reached or exceeded. The critical current level is established to be higher than the normal operating current level of the circuit, but somewhat lower than the latch-up holding current of the parasitic thyristor. As a result, if the parasitic thyristor attempts to latch, the resistance of the variable conductor sharply increases, limiting the current and preventing latch-up.

Preferably, the variable conductor means is a superconductor having a lower critical current value than the latch-up holding current. When the CMOS circuit attempts to latch up, current flow substantially increases through the parasitic thyristor. Since that current also flows through the superconducting material, and since the critical current is below the latch-up current, the increase in current serves to increase the resistance in the superconductor, thus limiting the current in the CMOS circuit and preventing latch-up. More particularly, the current flowing through the parasitic thyristor cannot reach the holding current level, or the voltage applied to the CMOS circuit cannot reach the holding voltage level and thus latch-up of the parasitic thyristor simply does not occur. Thus a transient might begin to turn parasitic thyristor on, but as soon as current flow increases, the sharply increased resistance characteristic of the superconductor comes into play preventing latch-up conditions from being reached and returning the parasitic thyristor to its off condition.

These and other objects, features, aspects and advantages of the present invention will become more apparent from the following detailed description when taken in conjunction with the accompanying drawings in which:

DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

In carrying out the present invention, variable conductor means are associated with a CMOS circuit and its operating power supply to control the power delivered to the CMOS circuit in such a way that the resistance in the supply circuit is sharply increased when power supply conditions indicate the possibility of latch-up. In order to better understand the latch-up phenomenon and the means by which it is prevented in accordance with the present invention, reference will first be made to FIG. 3.

Figure 3:
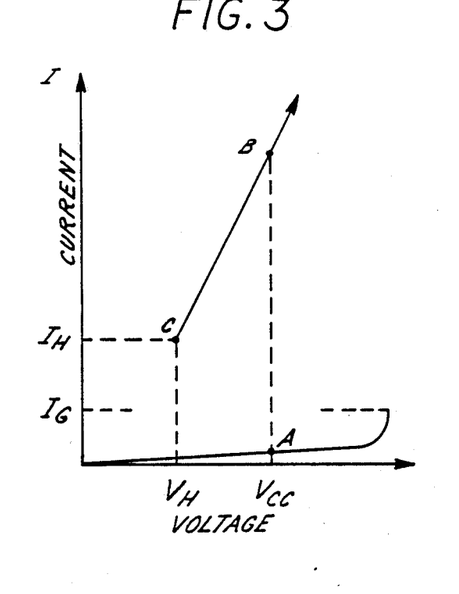
FIG. 3 is a diagram for explaining the latch-up phenomenon and illustrating the relationship between power-supply current and voltage applied to the CMOS circuit at the time of latch-up.

FIG. 3 is a diagram illustrating the relationship between the current flowing through the variable conductor means and the voltage applied to the parasitic thyristor within a CMOS integrated circuit. The normal operating condition of the CMOS circuit is illustrated at operating point A where the standard supply voltage $V_{cc}$ (such as 5 volts) is applied across the CMOS circuit and a very low current, such as 5 ma. is drawn. If, during normal operation at the operating point A, a surge is applied from the power supply or minority carriers are injected by internal operation of the CMOS circuit, the above-described parasitic thyristor structure can be triggered. Triggering of the parasitic thyristor will move the operating point from point A to point B, at which the supply voltage continues to be maintained at the desired level but current drawn by the CMOS circuit is substantially increased.

If conditions move to operating point B, and the power supply voltage $V_{cc}$ is not reduced, the substantially increased current illustrated at operating point B will continue to flow through the CMOS circuit. In the end power dissipated within the CMOS circuit as a result of the increased current flow will tend to destroy the circuit. If, however, the power supply voltage were reduced from $V_{cc}$ as illustrated at operating point B, a point can be reached where latch-up of the parasitic thyristor cannot be sustained and the thyristor turns off. That point is illustrated at operating point C in FIG. 3 which is defined by thyristor holding current $I_H$ and holding voltage $V_H$ below which conduction of the thyristor will not be sustained. As a result, if the current flow through the variable conductor means and to the thyristor is reduced below $I_H$, or the voltage drop across the variable conductor means is increased such the voltage applied to the CMOS circuit is reduced below $V_H$, the parasitic thyristor will be switched off. Thus, the operating point will be returned to the original operating point A at which normal circuit functioning continues.

In accordance with the invention, means are provided to assure that the variable conductor means exhibits a resistance characteristic which prevents the operating point B from ever being reached. More particularly, the operating conditions of the power supply are monitored such that if the current increases substantially beyond the normal operating current defined by operating point A toward the holding current level $I_H$, the resistance of the variable conductor means is sharply increased to limit the current, and to provide a voltage drop across the increased resistance which reduces the voltage applied to the CMOS circuit. The variable conductor means is configured to limit the current below the holding current level $I_H$, and/or to limit the voltage applied to the CMOS circuit below the holding voltage $V_H$, thus preventing latch-up of the parasitic thyristor. By virtue of the fact that the variable conductor means prevents the concurrent presence of the holding conditions, latch-up never occurs, circuit destruction by virtue of the parasitic thyristor latch-up condition is avoided, and the circuit automatically returns to its normal operating condition.

In short, by virtue of the fact that the variable conductor means maintains the current level through the CMOS circuit below $I_H$, the latch-up current, the CMOS circuit is rendered latch-up free.

Although the sharp acting variable conductor means can be implemented by various means, the preferred embodiment utilizes a superconductor interposed in series between the power supply and the CMOS circuit. As is well known, a superconductor, when maintained at very low temperatures, exhibits zero resistance. The geometry or other physical characteristics of the superconductor can be arranged, however, that when the current density exceeds a predetermined limit the superconductor exhibits a sharp increase in resistance and functions like a conventional conductor. The sharp resistance increase is utilized in accordance with the present invention to limit the current supplied by the power supply to the CMOS circuit below the holding current level, thereby preventing latch-up of the parasitic thyristor.

Figure 4:
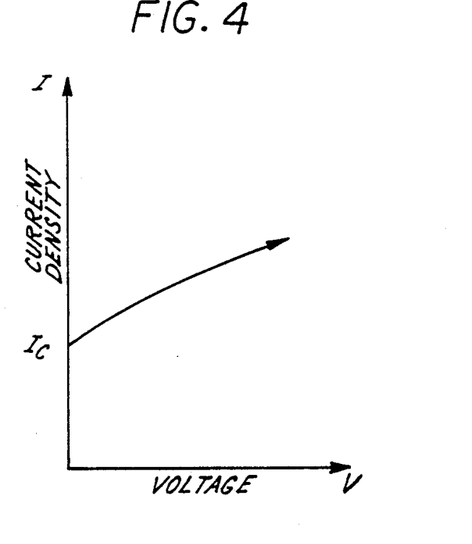
FIG. 4 is a diagram showing the relationship between the current density and voltage in a superconductor.

Turning now to FIG. 4, there is shown a diagram illustrating the relationship between voltage and current density in a superconductor usable in practicing the present invention. While units are not shown on the diagram, the voltage is typically measured in volts and the current density in amps per unit area such as amps per $cm^2$. The current density which will maintain the superconductor in its superconductive state has an upper level illustrated in FIG. 4 as $I_c$, the critical current density. At current densities below $I_c$ the superconductor exhibits no resistance and there is no resulting voltage drop across the superconductor. However, if the current density exceeds the critical level $I_c$, the superconductor begins to act like a normal resistive conductor, and the resistance which it exhibits is manifested as a voltage drop across the superconductor, all as illustrated in FIG. 4. Furthermore, FIG. 4 illustrates the sharp increase in resistance, characteristic of superconducting devices, and useful in quickly reacting to the CMOS circuit current increases to prevent the latch-up phenomenon.

Examining FIG. 4 in greater detail, it is seen that below the critical density $I_c$, superconduction current flows at zero resistance, such that there is no voltage drop across the superconductor. When the critical current density is exceeded, the superconductor begins to act like a normal conductor, exhibiting an electrical resistance which in turn results in a voltage drop across the superconductor. Thus, if a superconductor having such properties is utilized as a variable conductance means S1 or S2 of FIG. 5, and the characteristics of the device adjusted to complement those of the CMOS circuit in such a way that the critical current density is set above the normal current level drawn by the CMOS circuit but below the latch-up holding current level, a latch-up free CMOS circuit arrangement will be provided.

Figure 5:
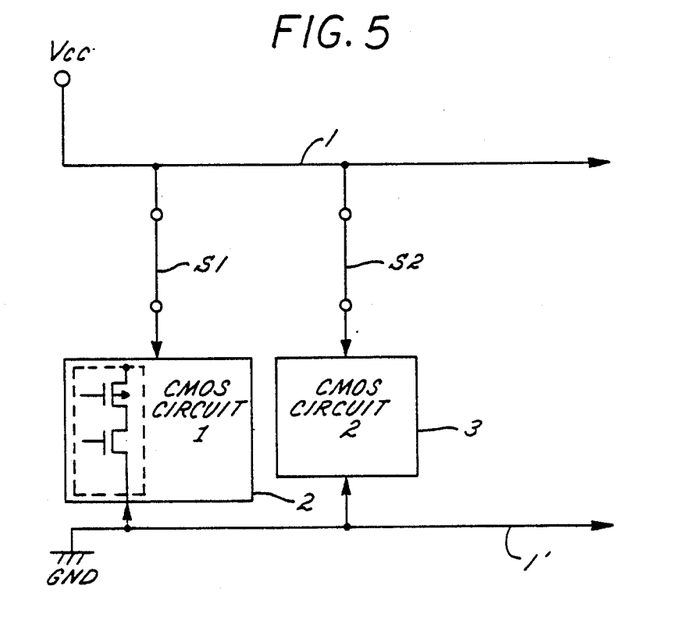
FIG. 5 is a diagram showing an example of a power distribution system for CMOS circuitry including a latch-up protection circuits according to the present invention.

FIG. 5 illustrates, in schematic fashion, an example of such a structure including a latch-up protected CMOS circuit. The power supply includes power buses 1, 1 connected to the $V_{cc}$ and ground terminals of the power supply. Variable conductor means S1, S2 ... are interposed in the supply circuit between the power connection of CMOS circuits 2, 3 and the power supply 1, 1. The variable conductor links or means S1, S2 are illustrated in FIG. 5 as being connected in series with the positive supply terminal; it will be apparent that such links can also be connected between the CMOS circuits and ground, the sole requirement being that the current from the power supply to the CMOS circuits passes through the variable conductor links.

As demonstrated by the illustration of CMOS circuit 2, each of the CMOS circuit groups 2, 3 has one or more P channel MOS transistors and N channel MOS transistors connected in series between the power supply terminals 1, 1'. The CMOS circuits 2, 3 may have any structure and typically are complex large scale integrated circuits which may or may not have similar operating current levels. In the event the current operating levels are dissimilar, the variable conductor links S1, S2 can be tailored to the expected current draw of the associated CMOS circuit. In addition, it is typical for many more CMOS circuits to be powered by the bus 1, 1', only two circuits being illustrated in FIG. 5 for purposes of convenience.

Figure 6A:
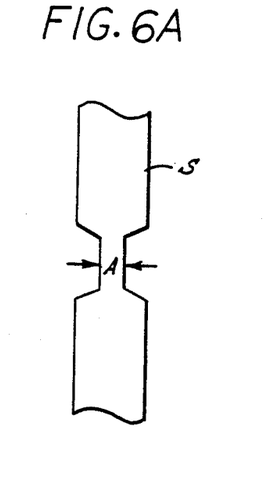
FIG. 6A is a diagram showing an example of the structure of a superconducting interconnection for supplying power to a CMOS circuit.

One form of superconducting structure, presently preferred, is illustrated in FIG. 6A. The superconductor is generally illustrated as S, and includes means for establishing a maximum superconducting current level, (denoted herein as $I_c'$). Such means are illustrated in FIG. 6A as a reduced cross-sectional area portion having a cross-sectional area A. The critical current density $I_c$ of the superconductor S is known, and the cross-sectional area A is established to provide a critical current limit $I_c$ which is below the holding current level of the parasitic thyristor. Thus, if a current greater than a latch-up holding current $I_c$ flows through the superconductor S, the current density in the reduced cross-sectional area A is increased beyond the critical current density, causing the reduced cross-sectional area A to sharply increase its resistance characteristic. As a result, a voltage drop appears across the cross-sectional area A, and the current is limited to a level below the holding current $I_H$ of the parasitic thyristor, and latch-up is prevented.

The reduced cross-sectional area A of the superconductor is set to satisfy the following criteria. The critical current density $I_c$ of the superconducting material S is established by the materials of which the superconductor is manufactured. The critical current flow $I_c'$ through the reduced cross-sectional area A is given by the area A multiplied by the critical current density $I_c$. Thus, the area A is adjusted based on the holding current of the parasitic thyristor and the critical current density of the superconductor to establish a critical current flow $I_c'$ which is below the holding current $I_H$.

From the foregoing description, it will be apparent that when the variable conductor means S1 satisfies the following two conditions, latch-up cannot occur in the CMOS circuits 2, 3:

(1) The critical current is less than the latch-up holding current $I_H$ of the CMOS circuit 2, 3, and (2) The voltage applied to the CMOS circuits 2 or 3 is reduced by virtue of the voltage drop across the variable conductors S1 or S2, resulting from operation as normal resistive conductors, and is less than the latch-up holding voltage $V_H$ of the CMOS circuits 2 or 3. Those relationships stated in the symbols described above are as follows:

$$V_{cc} - R \cdot I_H < V_H \quad (1)$$

$$(V_{cc} - V_H)/R < I_H.$$

Furthermore, the following condition must be satisfied:

(3) At the time of normal operation, the maximum density $I_M$ of current flowing at the time of normal operation of the CMOS circuit 2, 3 is less than the critical current density $I_c$ of the superconductor, that is, $$I_M < I_c.$$

A superconductor material satisfying the above described criteria (1) to (3) must be selected and the cross-sectional area (or other mechanism for establishing the critical current flow $I_c'$) must be established. In order to meet the above described conditions, the superconductor should satisfy the following requirements:

(i) The critical current density of the superconductor should be high, and (ii) Normal conduction resistivity at the time of transition to a normal conductor should be relatively high.

Recently developed superconductor material in the form of oxide ceramics with high critical temperatures are preferred. Such materials are described in (1) "Bulk Superconductivity of Y-Ba-Cu-O and Er-Ba-Cu-O" by H. Takagi et al., Japanese Journal of Applied Physics Vol. 26, No. 5, May 1987, pp. L601–L602, (2) "High $T_c$ Superconductivity of La-Ba-Cu Oxides" by S. Uchida et al., Japanese Journal of Applied Physics Vol. 26, No. 1, January 1987, pp. L1–L2, (3) "High-$T_c$ Superconductivity of La-Ba-Cu Oxides II. Specification of the Superconducting Phase" by H. Takagi et al., Journal of Applied Physics Vol. 26, No. 2, February 1987, pp. L123–L124, (4) "High Pressure Study and the Critical Current of High $T_c$ Superconductor $(La_{0.9}Sr_{0.1})_2 CuO_{4-y}$" by S. Yomo et al., Japanese Journal of Applied Physics Vol. 26, No. 5, May 1987, pp. L603–L605, (5) "Preparation of High $T_c$ Superconducting $(La_{1-x}Sr_x)_2 CuO_4$" by T. Nishihara et al., Japanese Journal of Applied Physics Vol. 26, No. 5, May 1987, pp. L606–L607. There references discloses superconductor material with critical temperatures below 77° K. In appropriate cases, however, other superconducting material can be used.

In an exemplary superconductor of an oxide ceramic group having high $T_c$ (the temperature of transition to a superconductor), the following conditions are achieved: the critical current density $= 10^4$ A/cm$^2$, normal conduction resistivity $= 10^{-2}$–$10^{-1}$ Ωcm.

On the other hand, in a conventional CMOS circuit, for example, the following conditions are typical:

normal power-supply current $= 5$ mA, the latch-up holding voltage $V_H = 2$ V (where power-supply voltage $V_{cc} = 5$ V), and latch-up holding current $I_H = 50$ mA.

If the above described values are used, the minimum cross-sectional area of a superconducting variable conductor link required to supply the normal power-supply current to the CMOS circuit (when in the superconduction mode) must take a value which is larger than the following area:

$$5(mA)/10^3 \sim 10^4 (A/cm^2) = 5 \times 10^{-8} \, cm^2 = 5 \, \mu m^2.$$

If the above described area is achieved in a superconducting link having a region of reduced cross-sectional area with a thickness of 1 μm, a width of 10 μm and a length of 20 μm (the interconnection in another region has a thickness of 1 μm and a width of about 50 to 100 μm), normal conduction resistance value in the region of the smallest cross-sectional area becomes as follows:

$$[20 \, \mu m/(1 \, \mu m \times 10 \, \mu m)] \times 10^{-2} \sim 10^{-1} \, \Omega \cdot cm = 200 \sim 2000\Omega.$$

When the specific values are substituted into the equation (1), the result becomes as follows:

When the power-supply voltage $V_{cc}$ equals 5V, the left side $= (5V - 2V)/(200 \sim 2000\Omega) = 1.5 \sim 15$ mA $< I_H$. Since the latch-up holding current $I_H$ is 50 mA, the equation (1) is satisfied, and as a result, latch-up is avoided.

It will now be apparent that use of such variable conductor means, such as a superconducting link, can be simply interposed between a CMOS circuit and its power supply. The superconductor is configured to have a reduced cross-sectional area satisfying both the conditions for normal operation and for limiting the holding current of the parasitic thyristor below the latch-up value. As a result, the latch-up phenomenon is avoided. It is noted, however, that in referring to the "reduced cross-sectional area" in the aforementioned description, there is no requirement that the area in all cases, be "reduced" in the sense that it is less than the cross-sectional area of another portion of a superconductor. For example, the superconductor can be of constant cross-sectional area, the entire area being capable of satisfying the provision of the critical current flow level $I_c'$ which prevents latch-up.

It will also be apparent that in the above described structure when the current density flowing through the superconductor, having exceeded the critical level such that the superconductor is operating as a normal conductor, is again reduced below the critical current density level $I_c$, the superconductor returns to the superconductive state. As a result, the full power supply voltage $V_c$ is again imposed on the CMOS circuit and normal operation is continued without occurrence of a latch-up.

As described in the foregoing, the CMOS circuit can be made latch-up free, if the transition between the superconducting state and the normal conducting state in a superconductor is utilized. More particularly, in order for a variable conductor means interposed between the power supply and a CMOS circuit to supply a latch-up holding current, the superconductor must be changed to the normal conducting state, and when the superconductor is changed to the normal conducting state, the variable conductor means cannot supply latch-up holding current because of its resistance. Thus, the characteristic of the superconductor portion is set so as to achieve the above, so that the CMOS circuit can be made latch-up free.

Although in the above described embodiment, a variable conductor link is formed of a superconductor at least a part of which has a reduced cross-sectional area, it is not intended to limit the shape of the link to that shown in FIG. 6A. More specifically, the links for power supply shown in FIG. 6A may be formed of a normal conductor such as aluminum, only a part of which includes a superconductor having the reduced cross-sectional area (that is, the superconductor has a constant cross-sectional area constructed according to the "reduced" criteria applied to cross-sectional area A of FIG. 6A.

Figure 6B:
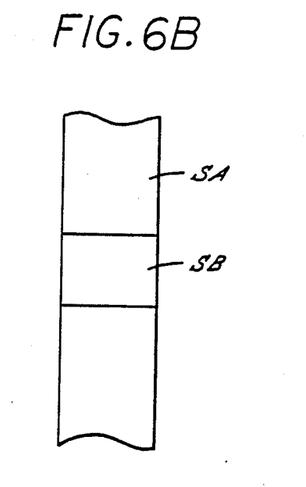
FIGS. 6B–6D are diagrams similar to FIG. 6A showing other examples of superconducting interconnections for supplying power to CMOS circuits.

FIG. 6B shows a further embodiment of a variable conductor means employing a superconductor. In the FIG. 6B embodiment two superconductor materials SA, SB are used, and they have different critical current densities. The critical current density of the material SB is selected to be less than that of the superconductor SA; and the overall cross-sectional area of the composite conductor is established such that the superconductor SB performs the same function as the reduced area region A of the superconductor of FIG. 6A, thereby achieving the same latch-up prevention effect.

Figure 6C:
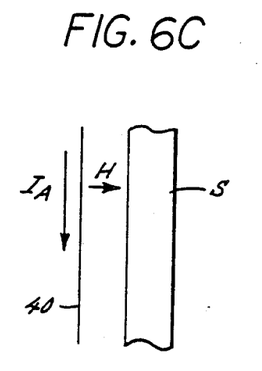

In the alternative embodiment illustrated in FIG. 6C, a conductor 40 is provided for carrying circuit between the power supply and the CMOS circuit, the conductor 40 also being interposed in series with the superconductor S. Current flow through the link 40 produces a magnetic field illustrated as H, and the conductor 40 and superconductor S are arranged in proximity such that the magnetic field H acts on the superconductor S, and when it increases to a level indicating the critical current $I_c'$ has been achieved, causes the superconductor S to sharply increase its resistance characteristic thereby to prevent latch-up.

Figure 6D:
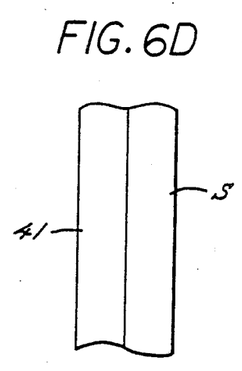

A final illustrative embodiment is shown in FIG. 6D in which a normal conductor 41, comparable to conductor 40 of FIG. 6C is disposed in contact with superconductor S. As in the case of FIG. 6C, current flow through conductor 41 creates a magnetic field which reduces the level of critical current in the superconductor S thus preventing latch-up.

As a further illustrative mechanism for controlling the critical current level of a superconductor, it is noted that the temperature of at least part of the superconducting link can be set higher than other regions of the circuit, reducing the critical current density in the region at the higher temperature level. That, like the reduced cross-sectional area of FIG. 6A, the higher critical current density of FIG. 6B or the flux-induced reduction in critical current density of FIG. 6C and 6D also reduces the critical current density in the region affected, thereby to control the level at which the superconductor sharply switches from a superconducting to a normally conducting condition.

It will be now be appreciated that numerous mechanisms are available for establishing the critical current density or critical current level through the superconductor at which the sharp transition is to take place. That flexibility of design combined with the speed of switching from a superconducting to a normally conducting mode is extremely useful in adapting the present invention to CMOS integrated circuits of varying degrees of complexity. The latch-up protective circuit according to the present invention is not only highly flexible in adapting to CMOS circuits of various designs, but also allows the increase in reliability and integration density of the underlying CMOS circuits.

Although the above described embodiments utilize the superconductor as the variable conductor link interposed between the power supply and CMOS circuits, it is not intended to limit the variable conductor link to superconductors. For example, any material whose resistance value can rapidly increase when more current than a latch-up holding current flows can be utilized to achieve the latch-up prevention effect.

I claim:

1. A CMOS circuit comprising in combination:
at least one P channel field effect transistor and at least one N channel field effect transistor, both formed on a predetermined region of a semiconductor substrate; first and second power supply connections for supplying operating power to the CMOS circuit, the P channel and N channel field effect transistors being so arranged on the semiconductor substrate as to produce a parasitic thyristor between said power supply connections, said parasitic thyristor having a holding current level above which said thyristor is maintained in the latched-up condition after being turned on and below which said thyristor is off, and protection means for preventing the latch-up of said parasitic thyristor in said CMOS circuit,
said protection means comprising variable resistance conductor means interposed in series with said power supply connections for passing current to the CMOS circuit and having a critical current level above which the variable resistance conductor means exhibits a sharply increased resistance,
the variable resistance conductor means being so constructed and arranged as to establish the critical current level above the current level normally drawn by the CMOS circuit but below said holding current level thereby to provide power for operation of said CMOS circuit but to prevent latch-up of the parasitic thyristor, the sharply increased resistance characteristic of the variable resistance conductor means responding with sufficient speed to the triggering of the parasitic thyristor as to reach said sharply increased resistance to prevent parasitic thyristor latch-up.

2. The combination as set forth in claim 1 wherein the variable resistance conductor means comprises a superconductor having a critical current density, and means for limiting the critical current density to said critical current level over at least a portion of said superconductor.

3. The combination as set forth in claim 2 wherein the means for limiting comprises a reduced cross-sectional area formed in said superconductor.

4. The combination as set forth in claim 2 wherein said superconductor comprises a composite superconductor including two superconductor materials having different critical current densities, one of said superconducting materials so constructed and arranged as to establish said critical current level.

5. The combination as set forth in claim 2 wherein the means for limiting comprises means for applying a magnetic field to at least a part of said superconductor, the magnetic field being related to the current flowing to the CMOS circuit from the power supply.

6. A CMOS system comprising:
a power supply;
a plurality of CMOS circuits arranged to be commonly powered from the power supply, each CMOS circuit including at least one P channel field effect transistor and at least one N channel field effect transistor, both formed on a predetermined region of a semiconductor substrate, first and second power supply connections for supplying operating power to the CMOS circuit, the P channel and N channel field effect transistor being so arranged on the semiconductor substrate as to produce a parasitic thyristor between said power supply connections, said parasitic thyristor having a holding current level above which said thyristor is maintained in the latch-up position after being turned on and below which said thyristor is off; and
a plurality of protection means for preventing the latch-up of said parasitic thyristors in said CMOS circuits, said plurality of protection means including a plurality of variable resistance conductor means coupled between the power supply and respective ones of the CMOS circuits, each variable resistance conductor means being interposed in series with said power supply connections for passing current to the CMOS circuit and having a critical current level above which the variable resistance conductor means exhibits a sharply increased resistance, the variable resistance conductor means being so constructed and arranged as to establish the critical current level above the current level normally drawn by the CMOS circuit but below said holding current level thereby to provide power for operation of said CMOS circuit but the prevent latch-up of the parasitic thyristor, the sharply increased resistance characteristic of the variable resistance conductor means responding with sufficient speed to the triggering of the parasitic thyristor as to reach said sharply increased resistance to prevent parasitic thyristor latch-up.

7. A CMOS circuit comprising at least a single P channel field effect transistor, at least a single N channel field effect transistor, both of said field effect transistors formed on a predetermined region of a semiconductor substrate, first and second power supply connections for providing power to the CMOS circuit, a parasitic thyristor formed over a semiconductor region of said P channel transistor and a semiconductor region of said N channel transistor and being formed between said first and second power supply connections, said CMOS circuit being in a latched-up conduction when the current flow through said parasitic thyristor is greater than a latch-up holding current, and means for protecting said CMOS circuit from latch-up, said protecting means comprising:

variable resistance conductor means connected to at least one of said first and second power supply connections, the resistance value of said variable resistance conductor means being sharply increased when current greater than said latch-up holding current flows through said at least one of said first and second power supply connections, the sharply increased resistance characteristic of the variable resistance conductor means responding with sufficient speed to the triggering of the parasitic thyristor as to reach said sharply increased resistance to prevent latch-up of the parasitic thyristor.

8. A latch-up protective circuit in accordance with claim 7, wherein
said variable resistance conductor means comprises a superconductor having a critical current level which is less than the value of said latch-up holding current.

9. A latch-up protective circuit in accordance with claim 8, wherein
said superconductor material has a region having a reduced cross-sectional area in at least a part thereof, said reduced cross-sectional level being diminished to establish the critical current level at a level less than said latch-up holding current.

10. A latch-up protective circuit in accordance with claim 9, wherein
the value of said reduced cross-sectional area is set such the level of current flowing through the variable resistance conductor means is less than the value of said latch-up holding current, both when the superconductor is in its superconducting state and in its normal conducting state.

11. A latch-up protective circuit in accordance with claim 8, wherein
said superconductor is formed by connecting in series a plurality of types of superconductor materials having different critical current values.

12. A latch-up protective circuit in accordance with claim 8, which further comprises
normal conductor material means for carrying current to said CMOS circuit and disposed in contact with at least a part of said superconductor.

13. A latch-up protective circuit in accordance with claim 8, which further comprises
magnetic field applying means provided closely adjacent to at least a part of said superconductor for generating a magnetic field in response to current flow to said CMOS circuit, and applying said magnetic field to said superconductor.

* * * * *